United States Patent
Gao

(10) Patent No.: US 11,612,080 B2
(45) Date of Patent: Mar. 21, 2023

(54) DATA CENTER AIRFLOW MANAGEMENT

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 637 days.

(21) Appl. No.: 16/588,264

(22) Filed: Sep. 30, 2019

(65) Prior Publication Data

US 2021/0100135 A1  Apr. 1, 2021

(51) Int. Cl.
*H05K 7/20* (2006.01)
*E04H 5/00* (2006.01)
*H05K 7/14* (2006.01)

(52) U.S. Cl.
CPC .......... *H05K 7/20745* (2013.01); *E04H 5/00* (2013.01); *H05K 7/1497* (2013.01); *E04H 2005/005* (2013.01)

(58) Field of Classification Search
CPC ............ H05K 7/20745; H05K 7/1497; H05K 7/20836; E04H 8/00; E04H 2005/005; E04H 5/02; E04H 5/00
See application file for complete search history.

(56) References Cited

U.S. PATENT DOCUMENTS

2014/0190198 A1* 7/2014 Slessman ............... F25B 25/00
62/314

FOREIGN PATENT DOCUMENTS

| CN | 108507085 A | * | 9/2018 |
| CN | 109475068 A | * | 3/2019 |
| JP | S60178240 A | * | 9/1985 |

OTHER PUBLICATIONS

Zhang et al., Multi Could Source Modular Regional Cooling . . . . System, Mar. 15, 2019, CN109475068A, Whole Document (Year: 2019).*
Andou, Blast Direction Change-Over Device for Duct, Sep. 12, 1985, JPS60178240A, Whole Document (Year: 1985).*
Huang, Evaporation Cooling Ventilation Air Conditioner System for Data Center Based on Solar Chimney, Sep. 7, 2018, CN108507085A, Whole Document (Year: 2018).*

* cited by examiner

*Primary Examiner* — Larry L Furdge
(74) *Attorney, Agent, or Firm* — Womble Bond Dickinson (US) LLP

(57) ABSTRACT

According to one embodiment, a data center air cooling system includes a first information technology (IT) room and a second IT room, each with electronic racks with one or more pieces of IT equipment. The system includes an air cooling unit that provides cooling air into an air chamber, which supplies the cooling air to the first IT room. The system includes an air duct system that supplies the cooling air from the air chamber to the second IT room and returns warmed air from the first IT room and the second IT room to the air cooling unit. The system includes several louvers that are each arranged to open and close independently and in different combinational modes to create several airflow management modes for cooling pieces of IT equipment in the first IT room, in the second IT room, or a combination thereof.

16 Claims, 12 Drawing Sheets

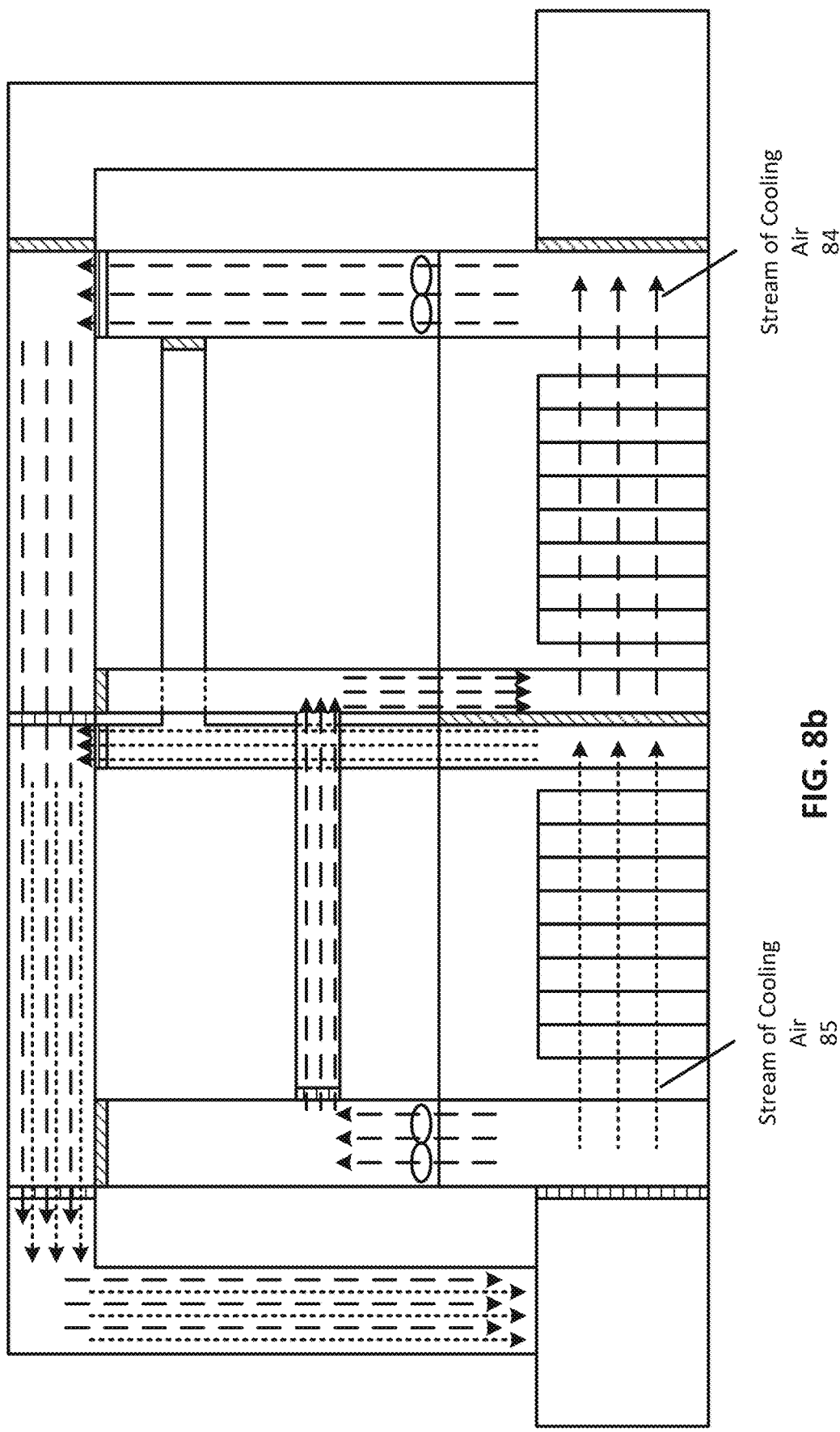

DATA CENTER AIRFLOW MANAGEMENT

FIELD

Embodiments of the present disclosure relate generally to a data center cooling air cooling system that cools Information Technology (IT) equipment in one or more IT rooms of a data center.

BACKGROUND

A data center is a building or a group of buildings used to house computer systems and associated components. In particular, a data center building includes a room that has several active electronic racks that may have servers and other Information Technology (IT) equipment that perform various services, such as telecommunication and storage systems. Thermal management for a data center is critical to ensure proper performance of the servers and IT equipment that is operating in the racks. Without proper thermal management, however, the thermal environment (e.g., temperature) within the racks may exceed thermal operational thresholds, which may result in adverse consequences (e.g., servers failing, etc.). The data center may manage the thermal environment by implementing an air cooling system that circulates air throughout a data center room in order to cool the racks. Specifically, the system may include a dedicated computer room air conditioning (CRAC) unit and chilled water system that monitors and maintains the thermal environment for a room by supplying cold air into cold aisles and drawing warmed air from hot aisles. These conventional air cooling systems, however, require a significant amount of the cooling energy consumption of the data center. Therefore, there is a need for an air cooling system that effectively and efficiently cools electronic equipment throughout a data center.

The present disclosure describes a data center air cooling system that efficiently cools several data center rooms based on the temperature requirements of the electronic racks in the rooms. For instance, each data center room may operate at a same (or similar) thermal condition or may operate at a different thermal condition, with respect to one another. Some rooms may need a lower air inlet temperature, while others may be suitable for a higher air inlet temperature. This is especially the case when a room uses a liquid cooling solution, in which some of the heat load of IT equipment is extracted to the liquid directly. In a liquid cooling data center room, the cooling air inlet temperature may be increased since the majority of heat generated by the IT equipment is captured by liquid cooling loops. To manage and cool several rooms efficiently, the data center air cooling system includes a combination of air ducts, air chambers, and louvers that enable the system to adjust the air inlet temperature and/or airflow inside each individual room based on the rooms temperature requirements. For example, the system may supply a room that needs a higher air inlet temperature with exhaust air from a room that needs a lower air inlet temperature. As a result, the present disclosure provides an efficient air cooling method.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

FIGS. 8a and 8b are block diagrams illustrating examples of airflow modes for cooling several IT rooms of a data center in parallel with different air cooling units according to one embodiment.

DETAILED DESCRIPTION

Figure 1:
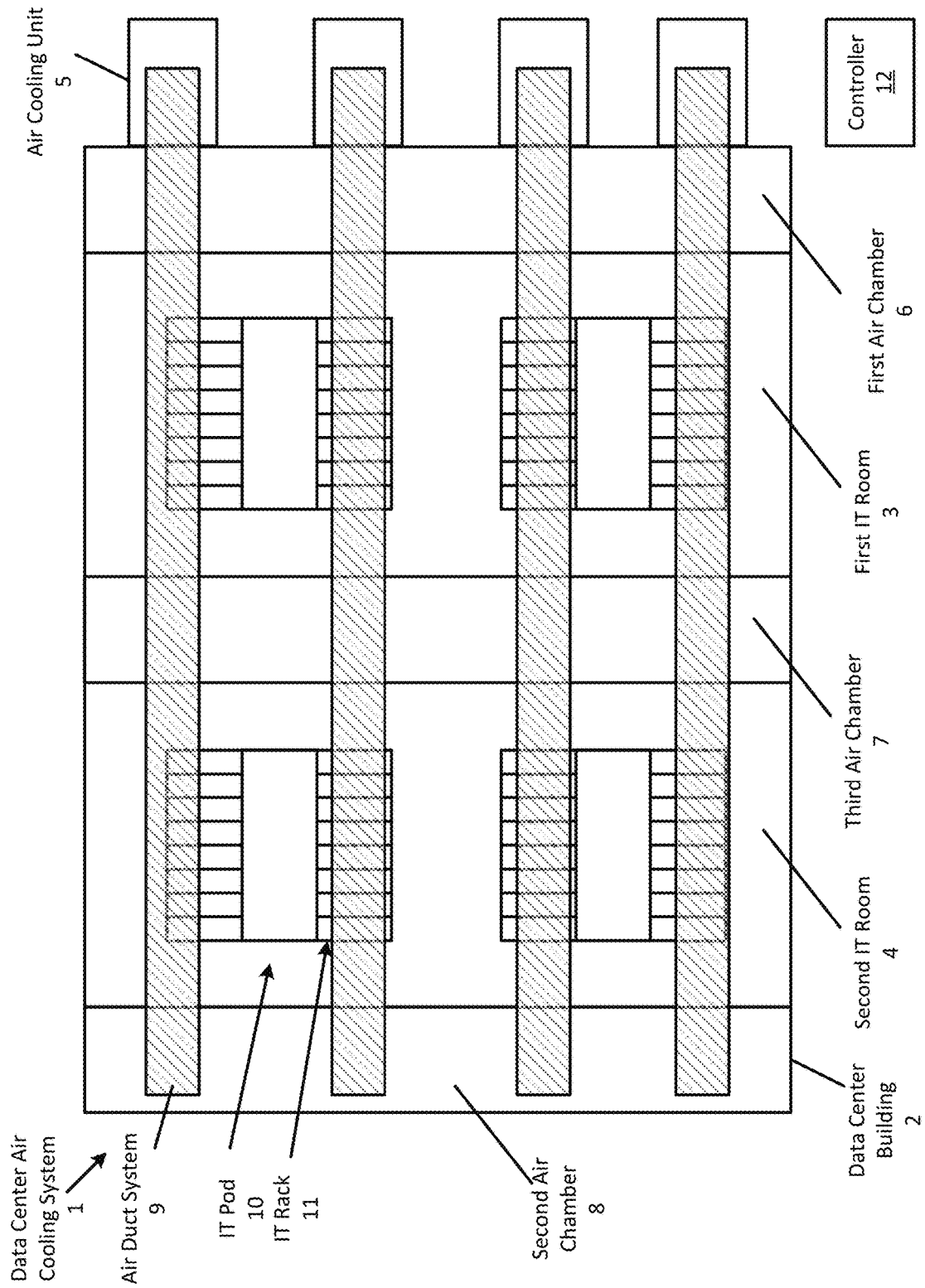
FIG. 1 is a block diagram illustrating a top-down view of an example of a data center air cooling system according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to one embodiment, a data center air cooling system includes a first information technology (IT) room configured to have a first set of electronic racks, each with one or more pieces of IT equipment and a second IT room configured to have a second set of electronic racks, each with one or more pieces of IT equipment. The system also includes an air cooling unit configured to provide cooling air into an air chamber of the system, where the air chamber is configured to supply the cooling air to the first IT room. The system also includes an air duct system that is configured to supply the cooling air from the air chamber to the second IT room and is configured to return warmed air from the first IT room and the second IT room to the air cooling unit. The system also includes several louvers that are configured to open or close independently and in certain combination manner to create several airflow modes for cooling pieces of IT equipment in the first IT room, the second IT room, or a combination thereof In one embodiment, the air chamber is a first air chamber and is between the air cooling unit and the first IT room, the system further includes a second air chamber and a third air chamber between the first IT room and the second IT room, where the second air chamber includes a first area adjacent to the first IT room and a second are adjacent to the second IT room, where a first louver of the several louvers is between the first area and the second area, where the second air chamber is adjacent to the second IT room and opposite of the third air chamber.

In one embodiment, the air duct system includes 1) a first air duct that connects the first air chamber with the second area of the third air chamber, 2) a second air duct that connects the second air chamber with the air cooling unit, and 3) a third air duct that connects the first area of the third air chamber to the second air duct.

In one embodiment, the several louvers include 1) a second louver between the first air chamber and the first air duct, 2) a third louver between the first area and the third air duct, and 3) a fourth louver between the second area and the first air duct. In some embodiments, one of the airflow modes includes an open first louver, a closed second louver, a closed third louver, and a closed fourth louver, which causes cooling air to flow serially through the first IT room, the second IT room, and back to the air cooling unit. In another embodiment, the system includes at least one fan that is configured to draw warmed air from the second air chamber that is warmed by pieces of IT equipment of at least one of the first and second sets of electronic racks and push the warmed air to the air cooling unit through the second air duct.

In some embodiments, one of the airflow modes includes a closed first louver, an open second louver, an open third louver, and an open fourth louver, which causes cooling air to flow separately and parallel through the first IT room and the second IT room. In one embodiment, the cooling air flowing through the first IT room flows at a different flow rate than cooling air flowing through the second IT room. In another embodiment, the system further includes at least one fan that is configured to draw cooling air from the first air chamber and push the cooling air to the second area of the third air chamber through the first air duct, while the system is in the parallel flow mode.

In some embodiments, the first IT room and the second IT room are either located in separate buildings/modules or in a same building/module.

According to another embodiment, another data center cooling system includes the first IT room, the second IT room, a first air cooling unit that is adjacent to the first IT room, and a second air cooling unit that is adjacent to the second IT room, where both air cooling units are configured to separately provide cooling air into the IT rooms. The system also includes an air duct system that is configured to supply cooling air to both rooms and return warmed air from both IT rooms to both air cooling units. The system also includes several louvers that are configured to open and close independently to create several airflow modes for cooling the pieces of IT equipment in the first IT room, in the second IT room, or a combination thereof In one embodiment, the system includes a first air chamber that is between the first air cooling unit and the first IT room and a second air chamber that is between the second air cooling unit and the second IT room. In some embodiments, the air duct system includes 1) a first air duct that connects the first air cooling unit with the second air cooling unit by having a first portion that connects to the first air cooling unit, a second portion that connects to the second air cooling unit, and a third portion that connects the first portion and the second portion together, 2) a second air duct that connects the first air chamber with the third portion of the first air duct, and 3) a third air duct that connects the second air chamber with the third portion of the first air duct.

In one embodiment, the several louvers include 1) a first louver between the second air duct and the first air duct, 2) a second louver between the first portion of the first air duct and the third portion of the first air duct, 3) a third louver between the third air duct and the first air duct, and 4) a fourth louver between the second portion of the first air duct and the third portion of the first air duct. In some embodiments, the system includes a first airflow mode that includes a closed first louver, an open second louver, an open third louver, and a closed fourth louver, which causes cooling air provided by the first air cooling unit to flow serially through the first IT room, the second IT room, and back to the first air cooling unit. The system also includes a second airflow mode that includes an opened first louver, a closed second louver, a closed third louver, and an open fourth louver, which causes cooling air provided by the second air cooling unit to flow serially through the second IT room, the first IT room, and then back to the second air cooling unit.

In one embodiment, the system further includes a third air chamber that is between the first IT room and the second IT room, which has a first area adjacent to the first IT room and a second area adjacent to the second IT room, where a fifth louver is between the first area and the second area, and where the air duct system further includes a fourth air duct that connects the first area of the third air chamber with the first air duct, a fifth air duct that connects the second area of the third air chamber with the first air duct, a sixth air duct that connects the fourth air duct with the third air duct, and a seventh air duct that connects the fifth air duct with the second air duct..

In one embodiment, the several louvers further include 1) a sixth louver between the seventh air duct and the second air duct, 2) a seventh louver between the fifth air duct and the first air duct, 3) an eighth louver between the sixth air duct and the third air duct, and 4) a ninth louver between the fourth air duct and the first air duct. In another embodiment, a first airflow mode includes a closed first louver, an open second louver, an open third louver, a closed fourth louver, a closed fifth louver, an open sixth louver, a closed seventh louver, a closed eighth louver, and an open ninth louver, which causes cooling air provided by the first air cooling unit to flow separately and parallel through the first IT room and the second IT room. A second airflow mode includes a second airflow mode that includes an open first louver, a closed second louver, a closed third louver, an open fourth louver, a closed fifth louver, a closed sixth louver, an open seventh louver, an open eighth louver, and a closed ninth louver, which causes cooling air provided by the second air cooling unit to flow separately and parallel through the first IT room and the second IT room.

In one embodiment, the several louvers include a tenth louver that separates the third portion of the first air duct, where the first louver, the second louver, and the ninth louver connect to the first air duct towards a first side of the ninth louver, while the third louver, the fourth louver, and the seventh louver connect to the first air duct towards a second side of the ninth louver that is opposite to the first side. In another embodiment, one airflow mode includes a closed first louver, an open second louver, a closed third louver, an open fourth louver, a closed fifth louver, a closed sixth louver, an open seventh louver, a closed eighth louver, an open ninth louver, and a closed tenth louver, which causes cooling air provided by the first air cooling unit to flow through the first IT room and back to the first air cooling unit, and causes cooling air provided by the second air cooling unit to flow through the second IT room and back to the second air cooling unit.

FIG. 1 is a block diagram illustrating a top-down view of an example of a data center air cooling system according to one embodiment. Specifically, this figure shows a data center air cooling system 1 (hereafter may be referred to as cooling system) that is configured to adjust airflow through several Information Technology (IT) rooms based on the IT rooms' temperature requirements. The system 1 includes a data center building 2 (or module) and several air cooling units 5. In one embodiment, the air cooling unit 5 may be an Indirect Evaporative Cooling (IDEC or IEC) unit that is configured to provide cooling air for the system. In another embodiment, the air cooling unit 5 may be an Air Handler Unit (AHU), or any type of air cooling unit. In some embodiments, the air cooling unit may be any type of air cooling unit, and at least some of the air cooling units shown herein may be the same (or different) with respect to one another. As illustrated, each air cooling unit 5 is outside and adjacent to (e.g., the first air chamber 6 of) the data center building 2. The units (or a portion of the units), however, may be positioned on top (e.g., on the roof) of the building 2. In another embodiment, at least some of the units may be part of (or adjacent to) a separate data center building. In some embodiments, the system 1 may include more or less units as illustrated in this figure, such as only one unit.

As shown, the data center building 2 includes (from right to left) a first air chamber 6, a first IT room 3, a third air chamber 7, a second IT room 4, and a second air chamber 8. The building 2 also includes an air duct system 9. In one embodiment, the building 2 may include more or less components (elements). For instance, the building may include one IT room or more than two IT rooms. As a result, an air chamber may separate each of the IT rooms from one another (e.g., the third air chamber 7). In another embodiment, IT rooms may not be separated by an air chamber, but rather are adjacent to one another (on at least one side).

Each of the IT rooms is configured to have (or be equipped) with a set of electronic racks. In particular, as an example, each IT room includes two IT pods 10, each pod with sixteen IT racks 11 (two rows of eight IT racks on either side of the pod). Each of the pods is arranged such that the rows of IT racks between the IT rooms are parallel with one another, and the pods are arranged with hot aisle and cold aisle fashion. In one embodiment, the pods and/or IT racks may be arranged differently between the IT rooms.

Each of the air chambers 6-8 run the length of the data center building 2, where the first air chamber 6 is between the first IT room and the air cooling units and the second air chamber 8 is adjacent to the second IT room, and furthest away from the air cooling units. The first chamber is configured to receive cooling air provided by (at least some of) the air cooling units. For instance, a cooling air output port of each of the air cooling units may be coupled to the first air chamber. In one embodiment, at least some of the air cooling units may be coupled via an air duct, which may be the case when the air cooling unit is separate from (or not a part of) the data center building 2 and/or may be a part of a different data center building, as described herein. In another embodiment, the first air chamber 6 is configured to hold the cooling air provided by at least some of the air cooling units at a high pressure. In one embodiment, at least some of the air chambers may be partitioned at one or more locations. For instance, the first air chamber 6 may be partitioned (e.g., in the middle), such that cooling air provided by some of the air cooling units (the top two) is separated from cooling air provided by other air cooling units (the bottom two). In one embodiment, the louvers can also be used by adjusting their open ratio to separate the cooling air in the air chamber(s), as described herein.

The second chamber 8 is configured to receive warmed air from either (or both) of the IT rooms and return the warmed air to the air cooling units, via the air duct system 9, as described herein. The third air chamber 7 is between both IT rooms, and, as described herein, is configurable based on an airflow mode of the system. For instance, the third air chamber 7 is configured to separate into two adjacent areas based on a desired airflow mode, using one or more louvers. In particular, the third air chamber 7 may be configured to allow air to flow between the IT rooms, and may be configured to separate the two IT rooms, such that both rooms have different air flows. More about adjusting the third air chamber 7 is described herein.

As described herein, each of the air chambers may be configured to supply and/or receive cooling air that is circulating through the system 1. To supply and receive cooling air, the air chambers may have holes (or openings) that allow air to flow between the air chamber and an adjacent room (or chamber), or flow between the air chamber and an air duct. In another embodiment, at least some air chambers may include louvers that may be opened and closed based on whether air should be allowed to flow in or out of the air chamber. More about louvers function and operation are described herein.

The air duct system 9 may include one or more air ducts and is configured to supply cooling air provided by the air cooling units (and from the first air chamber 6) to either of the IT rooms and is configured to return warmed air from either of the IT rooms to the air cooling unit. In one embodiment, the data center air cooling system 1 may include an air duct system 9 for each of the air cooling units, as illustrated in this figure. In another embodiment, there may be one air duct system 9 for at least two or more air cooling units. For instance, at least some of the four air duct systems 9 may be interconnected such air is drawn from (and/or supplied to) different locations within any air chamber and is mixed inside at least one air duct of the system. Although not illustrated, the data center air cooling system 1 also includes one or more louvers that are configured to open and close independently to create several airflow modes for cooling the pieces of IT equipment of the IT racks 11. Specifically, the louvers may be positioned between air ducts of the air duct system 9 to adjust airflow. A louver may also be positioned inside the third air chamber, such that while the louver is open the third air chamber is one continuous chamber and while closed the chamber is separated into two independent areas (or sub air chambers). More about the louvers is described herein.

The controller 12 may be a computing device (e.g., a piece of IT equipment), or may be a part of a computing device (e.g., such as a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines)). The controller may also include memory. In one embodiment, the controller 12 may be equipment located within the data center building 2, may be a part of one of the IT racks 11, or may be located at a separate location (e.g., in a different data center building). The controller 12 is configured to perform airflow management operations to control airflow within the data center air cooling system. In particular, the controller 12 is communicatively coupled (e.g., wired and/or wirelessly connected) with at least some of the louvers of the system 1 and is configured to control the louvers (e.g., by transmitting a control signal to control circuitry of the louvers, such as an electronic switch or motor) in order to cause the louver to open and/or close and/or adjust an open ratio of the louver. In one embodiment, the controller may control the louvers in order to create a desired airflow mode. More about the controller is described herein.

Figure 2:
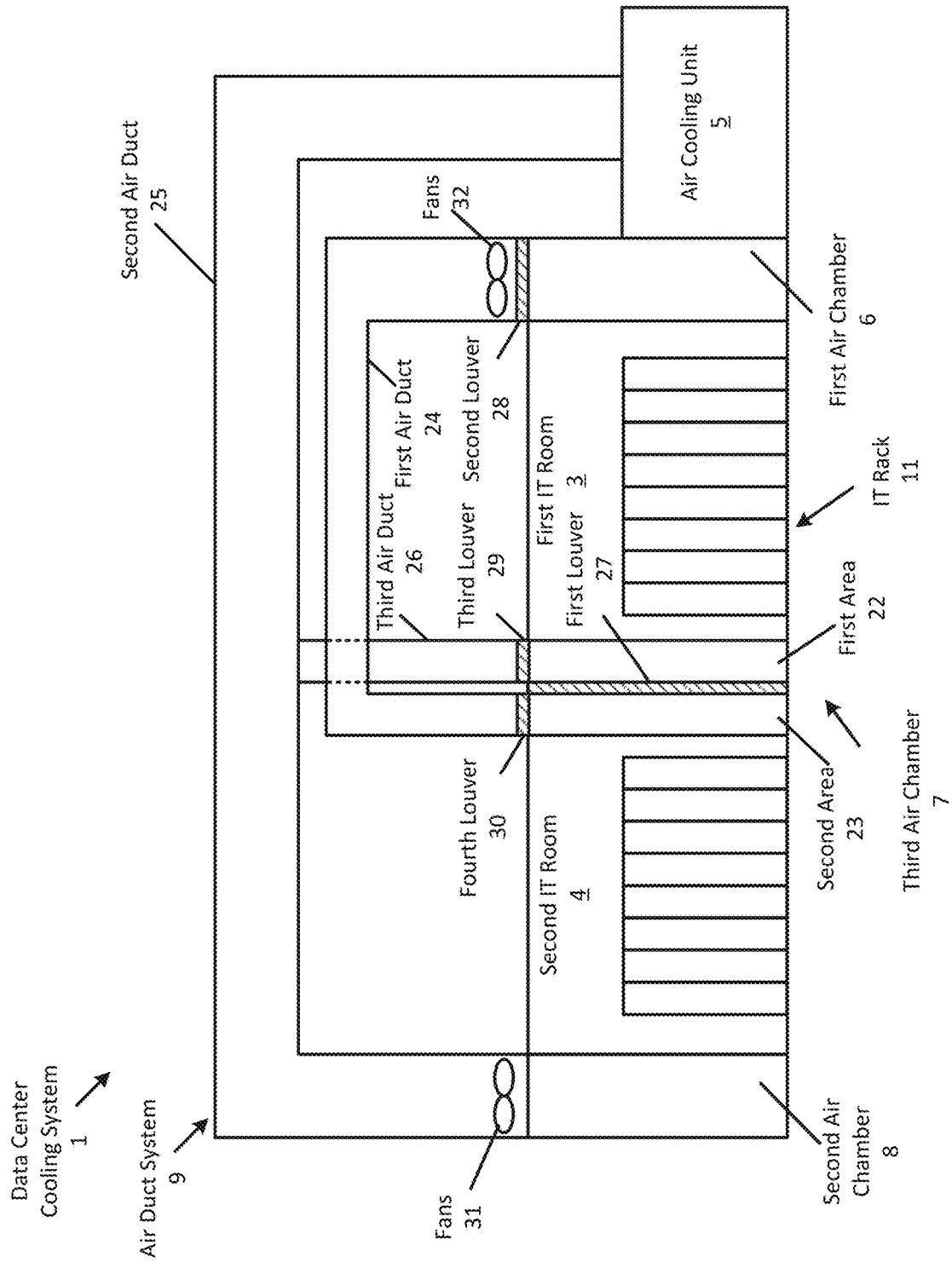
FIG. 2 is a block diagram illustrating a side view of a data center air cooling system according to one embodiment.

FIG. 2 is a block diagram illustrating a side view of a data center cooling system according to one embodiment. Specifically, this figure illustrates a side view of the data center cooling system 1, which includes several air ducts and louvers that enable for the creation of several airflow management modes. The system includes four louvers 27-30, which are each illustrated as being closed. In one embodiment, each of the louvers may include vanes that allow air to pass through when open and block air flow when closed. In particular, an open louver allows air or fluid to pass through substantially freely, while a closed louver does not allow air or fluid to pass through (from one side of the louver to another). The first louver 27 is positioned inside the third air chamber 7, which separates the third air chamber 7 into a first area 22 and a second area 23. As described herein, when the first louver 27 is open air is allowed to flow from the first area 22, through the first louver 27, and into the second area 23, and vice a versa. The second louver 28 is positioned on top of the first air chamber 6, the third louver 29 is positioned on top of the first area 22, and the fourth louver 30 is positioned on top of the second area 23. In one embodiment, the louvers may be coupled to a port (hole or opening) of each corresponding chamber. Specifically, a louver is coupled to a port such that the louver covers (or be placed on top of) an opening of a chamber, and when the louver is open air is allowed to exit the chamber and pass through the louver, as described herein.

In one embodiment, the system 1 may include more or less louvers as illustrated herein. For example, a louver may be positioned on top of the second air chamber. As another example, at least some of the air chambers may include one or more louvers. For instance, the first air chamber may include a louver, which when closed prevents air to flow between the first IT room 3 and the first air chamber 6. Similarly, the second air chamber may include a louver, which when closed prevents air to flow between the second IT room 4 and the second air chamber 8. In another embodiment, although the louvers are illustrated as running the entire width (or height) of the chambers, the louvers may be sized differently. For instance, rather than the first louver 27 running the entire height of the third air chamber, the first louver 27 may be smaller, such that it is positioned inside a wall that divides the third air chamber into the two areas.

The air duct system 9 includes three air ducts 24-26. The first air duct 24 connects the first air chamber 6 to the second area 23 of the third air chamber in order to allow air to flow from the first chamber to the second area. The second air duct connects the second air chamber 8 to the air cooling unit 5. Specifically, the second air duct may connect (or couple) to an air inlet port of the air cooling unit 5 that is configured to draw warm air in to be cooled (e.g., by a heat exchanger contained therein) into cooling air to be circulated back into the system 1. The third air duct 26 connects the first area 22 of the third air chamber 7 to the second air duct 25, which allows air to flow from the first area 22 and into the second air duct 25.

In one embodiment, at least some of the air ducts described herein connect to a corresponding air chamber via a louver that is positioned between the air duct and the air chamber. For example, the first air duct 24 connects to the first air chamber 6, via the second louver 28, and the first air duct 24 connects to the second area 23, via the fourth louver 30. In addition, the third air duct 26 connects to the first area 22 via the third louver 29. In one embodiment, the louvers may be arranged differently. For example, louvers (or at least some louvers) may be positioned inside the air ducts, or may be positioned in between air ducts. For instance, the second louver 28 may be positioned inside the first air duct 24. As a result, the first air duct may be connected directly to the first air chamber 6, rather than via the second louver 28.

The system 1 also includes two fans/fan systems 31 and 32. Both fans are configured to draw air from one direction and push the drawn air towards another direction. Specifically, fans 31 are configured to draw warmed air from the second air chamber 8 (which is warmed by pieces of IT equipment within the first IT room and/or the second IT room and push the warmed air to the air cooling unit 5, via the second air duct 25. Fans 32 are configured to draw cooling air from the first air chamber 6 and push the cooling air into the second area 23 of the third air chamber 7, via the first air duct 24. In one embodiment, the fans may include one or more fans to form a fan system. In another embodiment, the system 1 may include more or less fans, and the fans may be positioned in different locations. For instance, a fan may be positioned in the third air duct 26.

Figure 3:
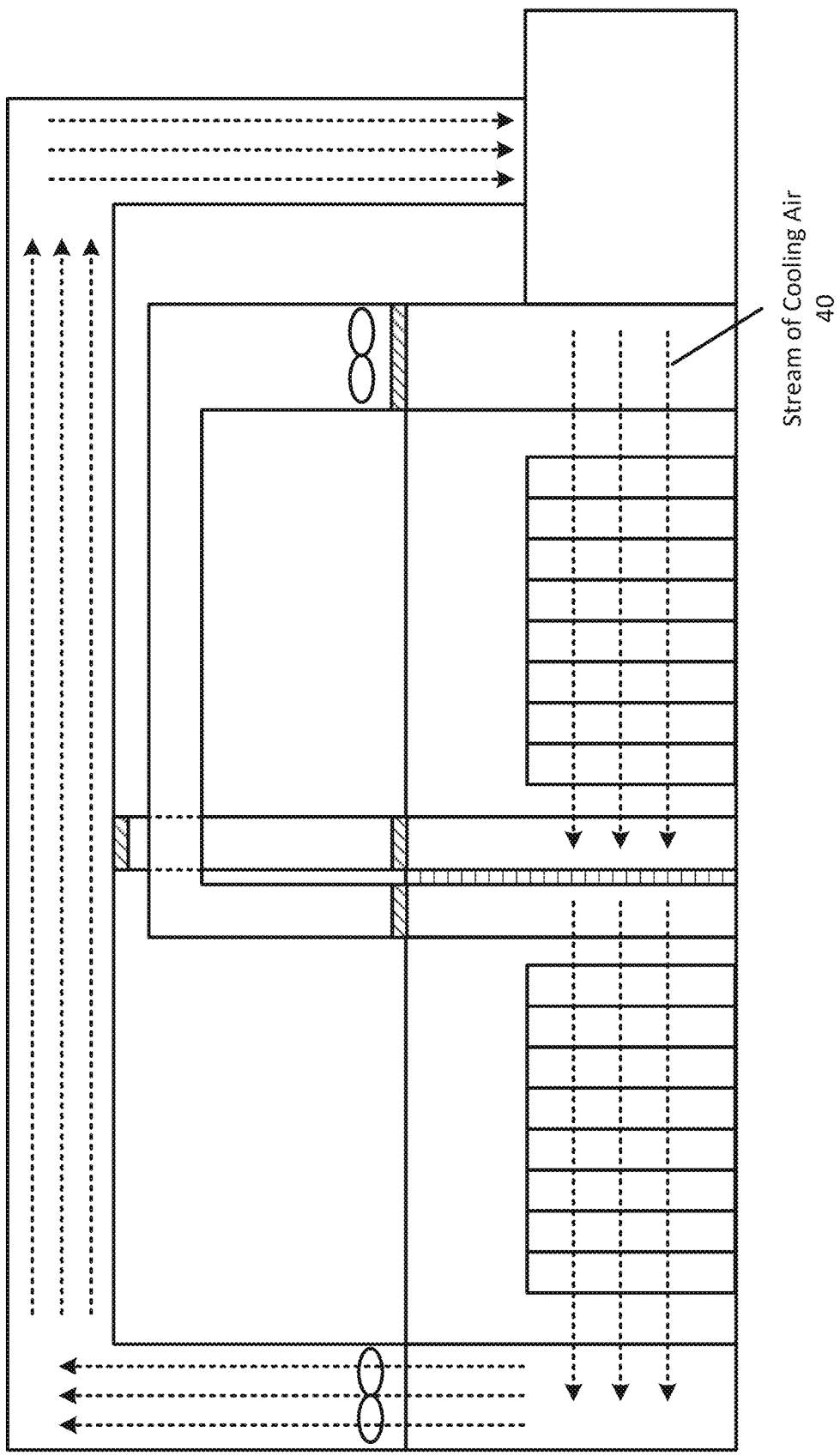
FIG. 3 is a block diagram illustrating an example of an airflow mode for serially cooling several IT rooms of a data center according to one embodiment.
Figure 4:
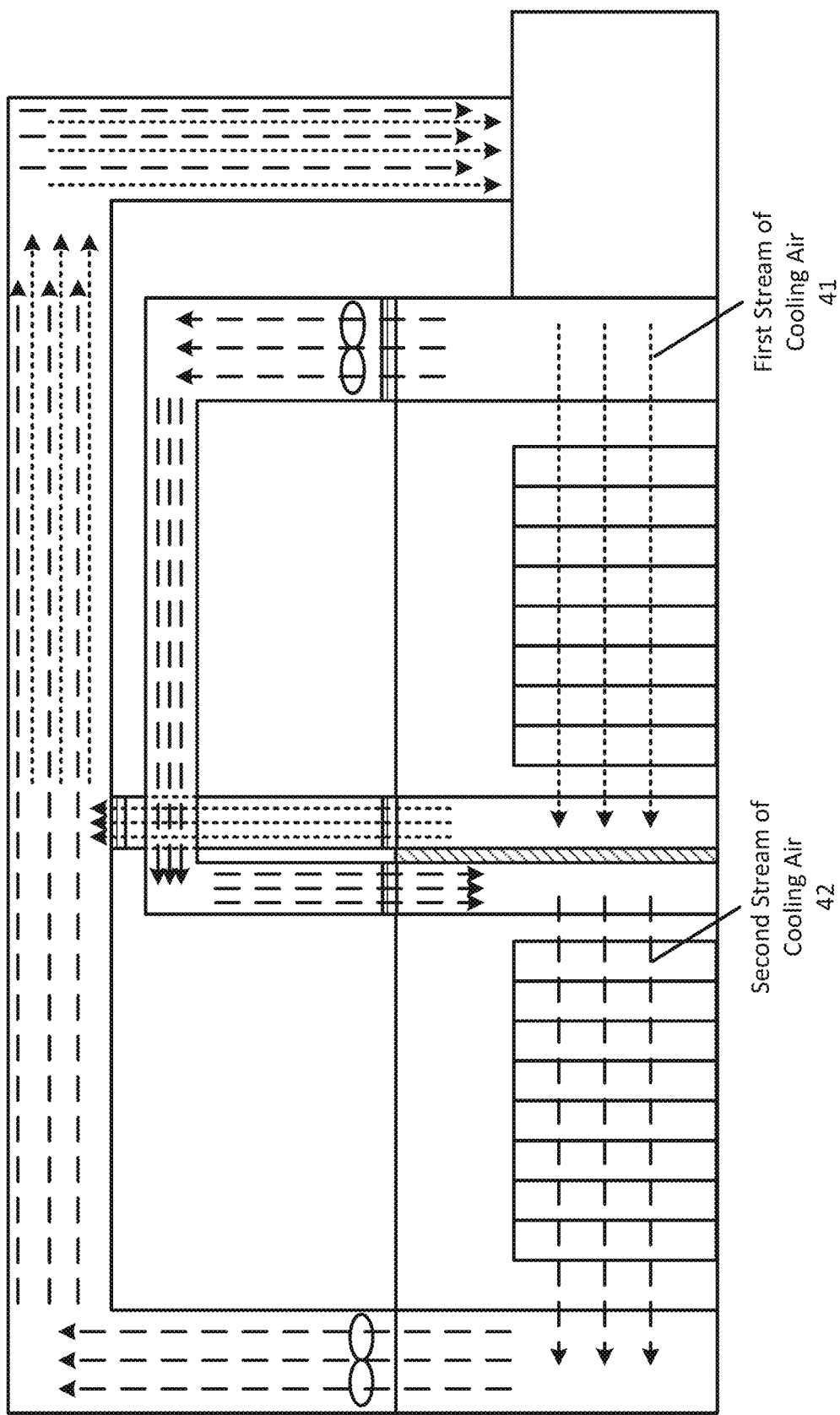
FIG. 4 is a block diagram illustrating an example of an airflow mode for cooling several IT rooms of a data center in parallel according to one embodiment.

As described herein, the controller 12 is configured to control at least some louvers (e.g., louvers 27-30) to create an airflow mode for cooling pieces of IT equipment in the first IT room 3, the second IT room 4, or both rooms. FIGS. 3 and 4 illustrate two airflow modes, which may be created according to whether the louvers are in an opened or closed position and at different combination scenarios.

FIG. 3 is a block diagram illustrating an example of an airflow mode for serially cooling several IT rooms of a data center according to one embodiment. Specifically, this figure shows a stream of cooling air 40 that is being provided by the air cooling unit is circulating through both IT rooms of the system 1 in series before returning back to the air cooling unit. To create this airflow mode, the first louver 27 is open, while the second louver 28, the third louver 29, and the fourth louver 30 are closed. In this mode, the air inlet temperature of the cooling air 40 entering the first IT room may be at a low temperature. As the cooling air moves through the first IT room, the air warms and enters the third chamber at a higher temperature, which is the air inlet temperature of the second IT room. The air flows through the second IT room and enters the second chamber at an even higher temperature than the temperature of the air in the third air chamber. The warmed air in the second air chamber than circulates back to the air cooling unit. In one embodiment, while in this airflow mode the fans 31 may be active (e.g., drawing warmed air from the second air chamber), while the fans 32 are deactivated.

This airflow mode may be preferable when the pieces of IT equipment in the second IT room are not primarily air cooled, but rather cooled using another method such as liquid cooling. Since the IT equipment in the second room does not primarily rely on air cooling or the majority of the heat produced by the IT equipment is extracted by liquid directly, or the majority of the electronics are liquid cooled, the cooling air entering the second IT room may be designed and operated at a higher (warmer) are inlet temperature than an IT room that relies primarily on air cooling. In this case, the first IT room may be air cooled, in order to take advantage of the lower inlet air temperature as compared to the temperature of the second IT room.

FIG. 4 is a block diagram illustrating an example of an airflow mode for cooling several IT rooms of a data center in parallel according to one embodiment. This figure shows that two separate streams of cooling air are circulating through the system 1. In particular, a first stream of cooling air 41 is circulating through the first IT room (from the first air chamber 6), into the first area 22 of the third air chamber 7, through the third air duct 26, and returns to the air cooling unit via the second air duct. The second stream of cooling air 42 circulates through the first air duct 24 (from the first air chamber 6 and through the first air duct 24), into the second area 23, through the second IT room, into the second air chamber 8, and returns to the air cooling unit through the second air duct, mixing with the cooling air 41. The air that enters the first area of the third air chamber may be warmed by the IT equipment in the first IT room, while air that enters the second air chamber 8 may be warmed by the IT equipment in the second IT room. To create this airflow mode, the first louver 27 is closed, while the second louver 28, the third louver 29, and the fourth louver 30 are opened. This mode may be considered a parallel airflow mode, since both IT rooms receive the separate streams of cooling air from the first air chamber. In one embodiment, while in this airflow mode fans 31 may be active and fans 32 may be active (e.g., drawing cooling air from the first air chamber and pushing cooling air to the second area of the third air chamber through the first air duct).

This airflow mode may be preferable when the pieces of IT equipment in both IT rooms are primarily air cooled. As a result, since the stream of air 42 cooling the second IT room is from the air chamber 6, rather than being the exhaust warmed air form the first IT room, the air inlet temperature of the second IT room in this mode may be the same or similar to the air inlet temperature of the first stream of cooling air 41 entering the first IT room. As another example, this airflow mode may be preferable when the IT equipment in both IT rooms are primarily liquid cooled and with much higher density. As a result, since the amount of cooling air flow is decreased, the cooling air is still sufficient to support multiple rooms in parallel.

In one embodiment, the controller is configured to (individually) control the louvers and/or fans of the data center air cooling system to adjust a flow rate of the cooling air streaming throughout the system. Specifically, the controller 12 may adjust an open ratio of a louver (e.g., by instructing control circuitry of the louver to close or rotate the vanes such that they partially close the louver) to reduce a flow rate of cooling air that is streaming through the system 1. As an example, the controller 12 may adjust an open ratio of the first louver (e.g., by causing the vanes to be 50% closed with respect to being fully opened) to reduce a flow rate of streaming cooling air 40, while the system is in the airflow mode illustrated in FIG. 3. As a result, the cooling air flowing through the first IT room may flow at a different rate than the air flowing through the second IT room. Similarly, the controller may adjust an open ratio of the second louver (e.g., by causing the vanes to be 30% closed) to reduce a flow rate of the second stream of cooling air 42, with respect to a flow rate of the first stream of cooling air 41, while the system is in the airflow mode illustrated in FIG. 4. With respect to the fans 31 and 32, the controller 12 may adjust a fan speed of either of the fans 31, while the fans are active, to increase/decrease the flow rate.

In another embodiment, the controller 12 is configured to (automatically) adjust the flow rate based on thermal conditions. For instance, the controller may adjust the flow rate based on the temperature inside either IT room. The controller may obtain temperature data from temperature sensors (not shown) that are positioned inside both IT rooms. When the temperature within a room reaches a threshold, the controller may adjust vane position and/or fan speed in order to increase the flow rate of cooling air through the room.

As described thus far, the first IT room 3 and the second IT room 4 are located in (or are a part of) the same data center building 2 or module. In another embodiment, however, both IT rooms may be located in separate data center buildings. In this case, the first area 22 and the second area 23 may be separate air chambers that are connected to each other with an air duct (where at least one of the separate air chambers is connected to the air duct via a louver). As a result, both rooms may be cooled serially and in parallel, but be in different buildings all together.

Figure 5:
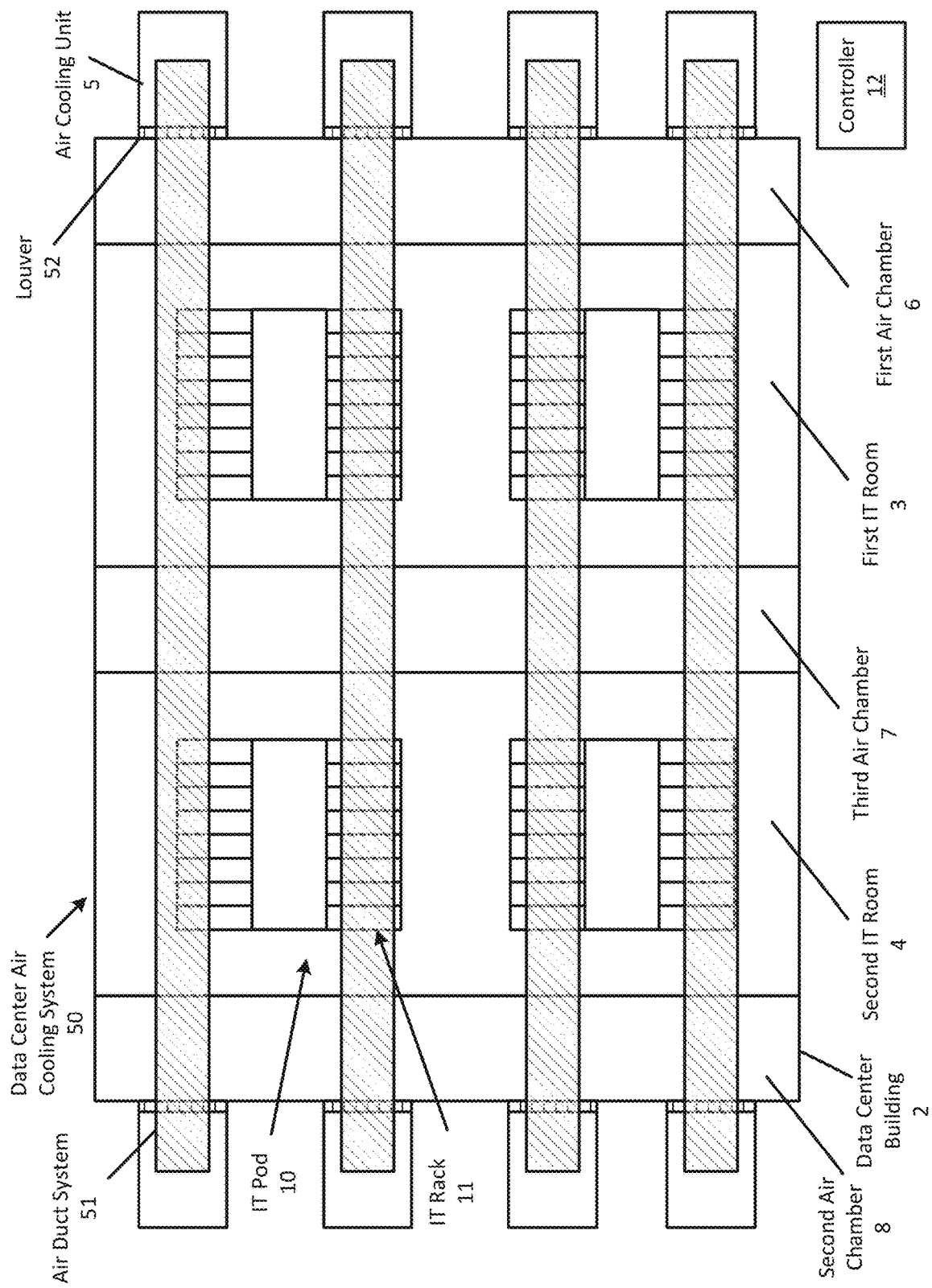
FIG. 5 is a block diagram illustrating a top-down view of another example of a data center air cooling system according to one embodiment.

FIG. 5 is a block diagram illustrating a top-down view of another example of a data center air cooling system according to one embodiment. This figure shows a data center air cooling system 50 in which both sides of the data center building 2 are equipped with at least one air cooling unit 5, as opposed to having at least one air cooling unit on one side as described with respect to system 1 of FIG. 1. Specifically, there are is a first set of air cooling units that are configured to provide cooling air to the first air chamber 6 and there is a second set of air cooling units that are configured to provide cooling air to the second air chamber 8. As described herein, the air cooling units may be adjacent to the air chambers, as illustrated here, or may be located on the roof of the building 2 or may be located separate from the building. Between each of the air cooling units 5 and their respective air chamber, there is a louver 52. In one embodiment, the controller 12 is configured to open the louver 52 when a corresponding air cooling unit is providing cooling air. Otherwise, the louver 52 may be closed. In one aspect, the data center air cooling system 50 may include the same or different components of the data center air cooling system 1.

There are several advantages to having air cooling units providing cooling air at either side of the data center building 2. For example, as described herein, the data center air cooling system 50 may operate in a similar manner as the data center air cooling system 1. Specifically, air cooling units on the right side of the building may provide the cooling air. Air cooling units on the left side of the building may be redundant units that only provide cooling air when the air cooling units on the right side are deactivated (e.g., during maintenance). Another benefit described herein is the ability to provide cooling air to both IT rooms at different inlet air temperatures. Another benefit is to provide flexibilities on redundant design and potential future room upgrading.

This system also includes an air duct system 51 that may include one or more air ducts and is configured to supply cooling air provided by air cooling units from either side of the building 2 to either of the IT rooms and is configured to return warmed air to air cooling units at either side of the building. Similar to the air duct system 9, the system 51 may include one or more louvers that are configured to open and close independently to create several airflow modes, as described herein. More about the system's louvers is described herein.

Figure 6:
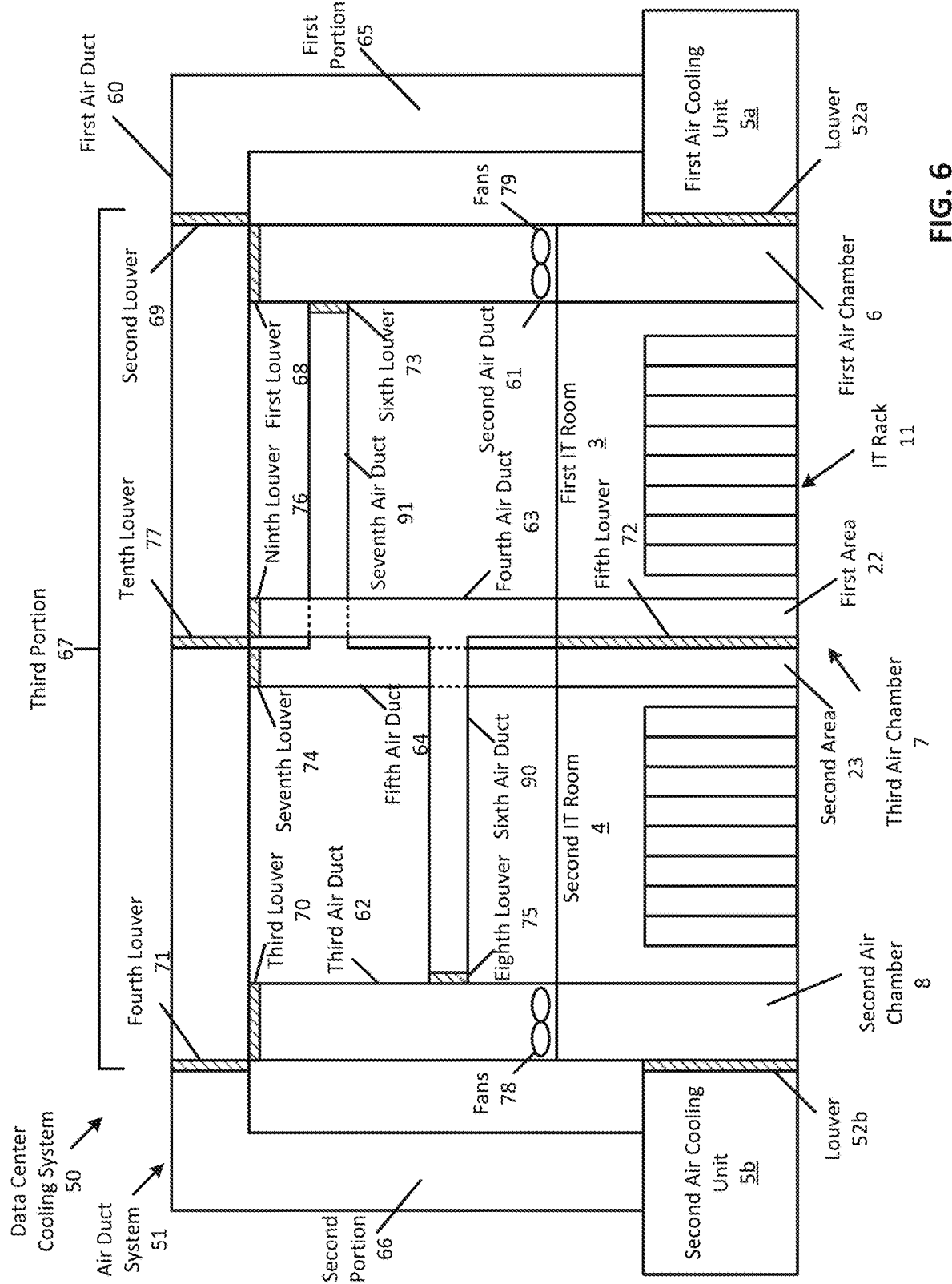
FIG. 6 is a block diagram illustrating a side view of a data center air cooling system with several air cooling units according to one embodiment.

FIG. 6 is a block diagram illustrating a side view of a data center air cooling system with several air cooling units according to one embodiment. Specifically, this figure illustrates a side view of the data center cooling system 50, which includes several air ducts and louvers that enable for the creation of several airflow management modes. As show, the layout of the cooling system 50, in particular the air chambers and IT rooms, is similar to the layout of cooling system 1. As described herein, this cooling system includes two air cooling units (each belonging to one of the groups illustrated in FIG. 5). In particular, there is a first air cooling unit 5a that is adjacent to the first air chamber 6 and is configured to provide cooling air to this chamber, and there is a second air cooling unit 5b that is adjacent to the second air chamber 8 and is configured to provide cooling air to this chamber. In one aspect, both air cooling units may be the same type of cooling unit (e.g., each being an IDEC unit), or the units may be different (e.g., one an IDEC unit and the other an AHU). Also, between the first air cooling unit 5a and the first air chamber 5 is a louver 52a and between the second air cooling unit 5b and the second air chamber 8 is louver 52b.

The air duct system 51 includes seven air ducts 60-64 and 90-91. The first air duct 60 connects (e.g., an air intact port of) the first air cooling unit 5a to (e.g., an air intact port of) the second air cooling unit 5b. Specifically, the first air duct 60 includes a first portion 65 that connects to the first air cooling unit 5a, a second portion 66 that connects to the second air cooling unit 5b, and a third portion 67 that connects the first portion and the second portion together. The second air duct 61 connects the first air chamber 6 to the (e.g., third portion 67 of) the first air duct 60 and the third air duct 62 connects the second air chamber 8 to the (e.g., third portion 67 of) the first air duct 60. The fourth air duct 63 connects the first area 22 of the third air chamber 7 to the (third portion 67 of the) first air duct 60 and the fifth air duct 64 connects the second area 23 of the third air chamber 7 to the (third portion 67 of the) first air duct 60. The sixth air duct 90 connects the third air duct 62 to the fourth air duct 63 and the seventh air duct 91 connects the second air duct 61 to the fifth air duct 64.

The system 50 also includes several louvers 68-77. A first louver 68 is between the second air duct and the third portion of the first air duct, a second louver 69 is between the first portion of the first air duct and the third portion of the first air duct, the third louver 70 is between the third air duct and the third portion of the first air duct, a fourth louver 71 is between the second portion of the first air duct and the third portion of the first air duct, a fifth louver 72 separates the third air chamber into the first and second areas, a sixth louver 73 is between the seventh air duct and the second air duct, a seventh louver 74 between the fifth air duct and the third portion of the first air duct, an eighth louver 75 between the sixth air duct and the third air duct, and a ninth louver 76 between the fourth air duct and the third portion of the first air duct.

The third portion of the first air duct also includes a tenth louver 77. As illustrated, the tenth louver 77 is in the middle of the third portion and separates the third portion into two separate air ducts. In one embodiment, the tenth louver 77 may not be positioned in the middle. As shown, the first louver, the second louver and the ninth louver connect to the third portion of the first air duct towards a first side of the tenth louver (e.g., a first air cooling unit side), and the third louver, the fourth louver and the seventh louver connect to the third portion of the first air duct towards a second, opposite side of the tenth louver (e.g., a second air cooling unit side).

The system 50 also includes two fans 78 and 79, each configured to draw air from one direction and push the drawn air towards another direction, as described herein. In one embodiment, any fans described herein may be configured to be reversible, such that the fans may be configured to draw and push air towards either one of two directions. For example, the controller 12 may configure fans 78 to draw air from the second air chamber and push the air through the third air duct, or conversely the fan may be configured to draw air from the third air duct and push the air into the second air chamber. In one embodiment, the controller may configure the fans based on which airflow mode the system is implementing. In another embodiment, at least one additional fan or fan system may be added to the configuration.

In one embodiment, the system 50 may include less louvers and/or air ducts. For example, the system may not include at least one of the fourth air duct 63, the fifth air duct 64, the sixth air duct 90, and the seventh air duct 91. As a result, the system may not include the louvers 73-77. In another embodiment, the system 50 may include more louvers and/or air ducts. For instance, the system may include a louver between every air duct connection with an air chamber, such as the louvers illustrated in FIG. 2.

Figure 7A:
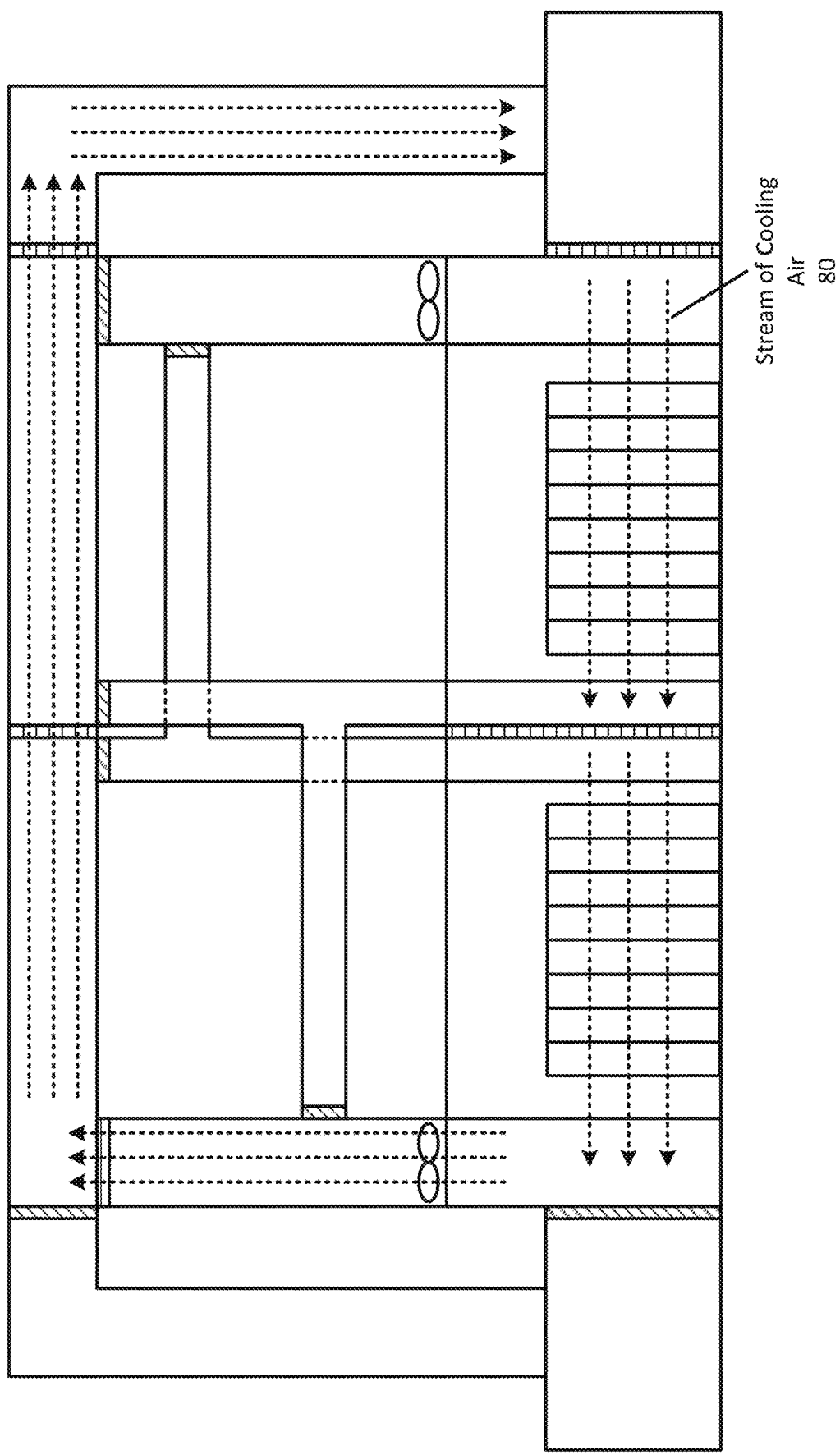
FIGS. 7a and 7b are block diagrams illustrating examples of airflow modes for serially cooling several IT rooms of a data center with different air cooling units according to one embodiment.
Figure 7B:
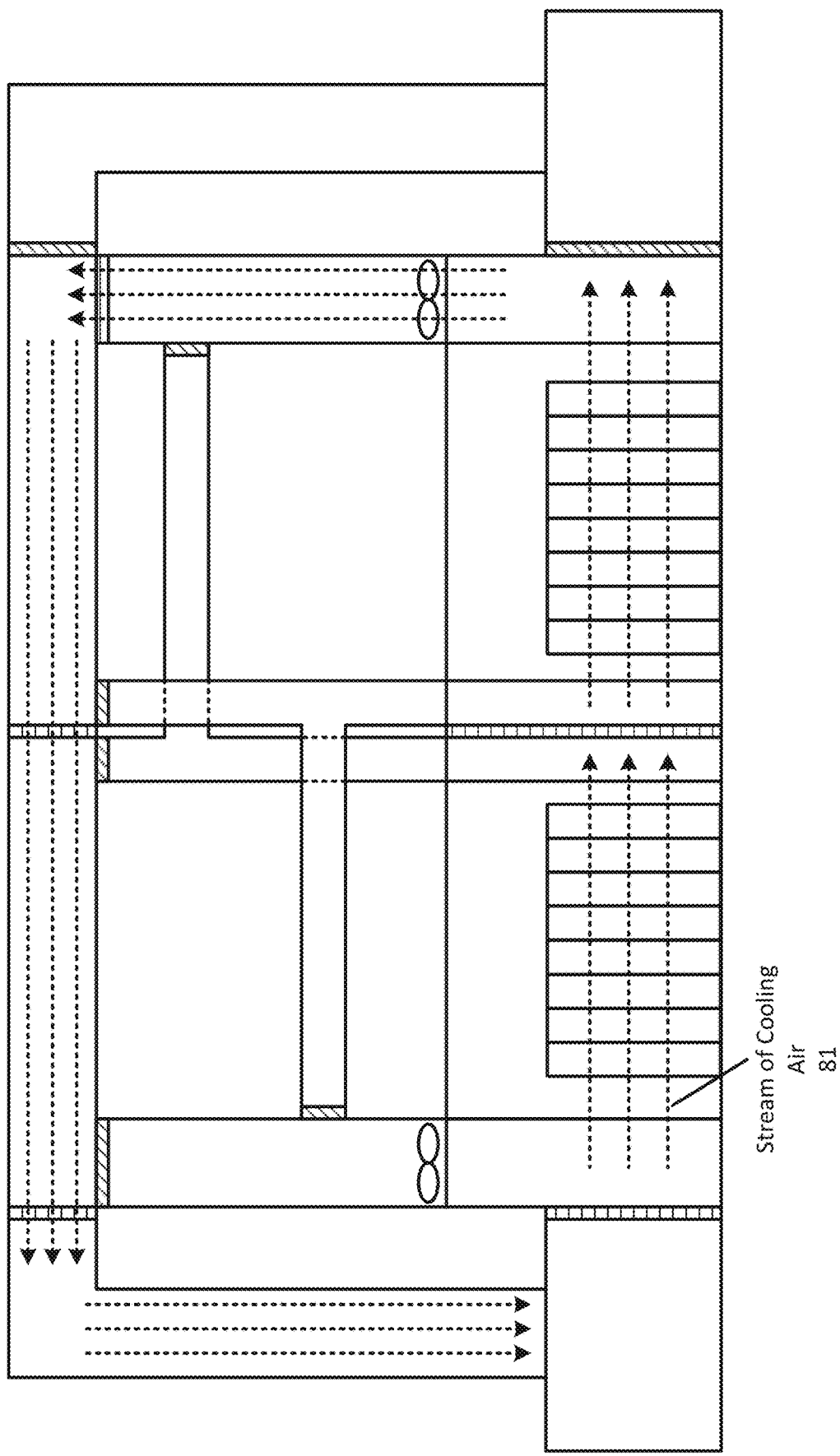

As described herein, the controller 12 is configured to control at least some of the louvers (e.g., louvers 68-77) to create an airflow mode for cooling pieces of IT equipment in the IT rooms. FIGS. 7a and 7b illustrate a similar airflow mode as shown in FIG. 3, while FIGS. 8a and 8b illustrate a similar airflow mode as shown in FIG. 4.

FIGS. 7a and 7b are block diagrams illustrating examples of airflow modes for serially cooling several IT rooms of a data center with different air cooling units according to one embodiment. Specifically, both figures illustrate serial airflow modes in which only one of the air cooling units is providing cooling air, while the other is on standby (or deactivated). FIG. 7a shows a stream of cooling air 80 that is being provided by the first air cooling unit 5a and is circulating through both IT rooms of the system 50 in series before returning back to the first air cooling unit. To create this airflow mode, the second louver 69, the tenth louver 77, the third louver 70, and the fifth louver 72 are open, while the first louver 68, the sixth louver 73, the ninth louver 76, and seventh louver 74, the fourth louver 71, and the eighth louver 75 are closed. In addition, louver 52a is open, but since the second air cooling unit is not providing cooling air, louver 52b is closed.

FIG. 7b shows a stream of cooling air 81 that is being provided by the second air cooling unit 5b and is circulating through both IT rooms in series before returning back to the second air cooling unit. To create this airflow mode, the first louver 68, the tenth louver 77, the fourth louver 71, and the fifth louver 72 are open, while the second louver 69, the sixth louver 73, the ninth louver 76, the seventh louver 74, the third louver 70, and the eighth louver 75 are closed. Also, louver 52a is closed and louver 52b is open.

Figure 8A:
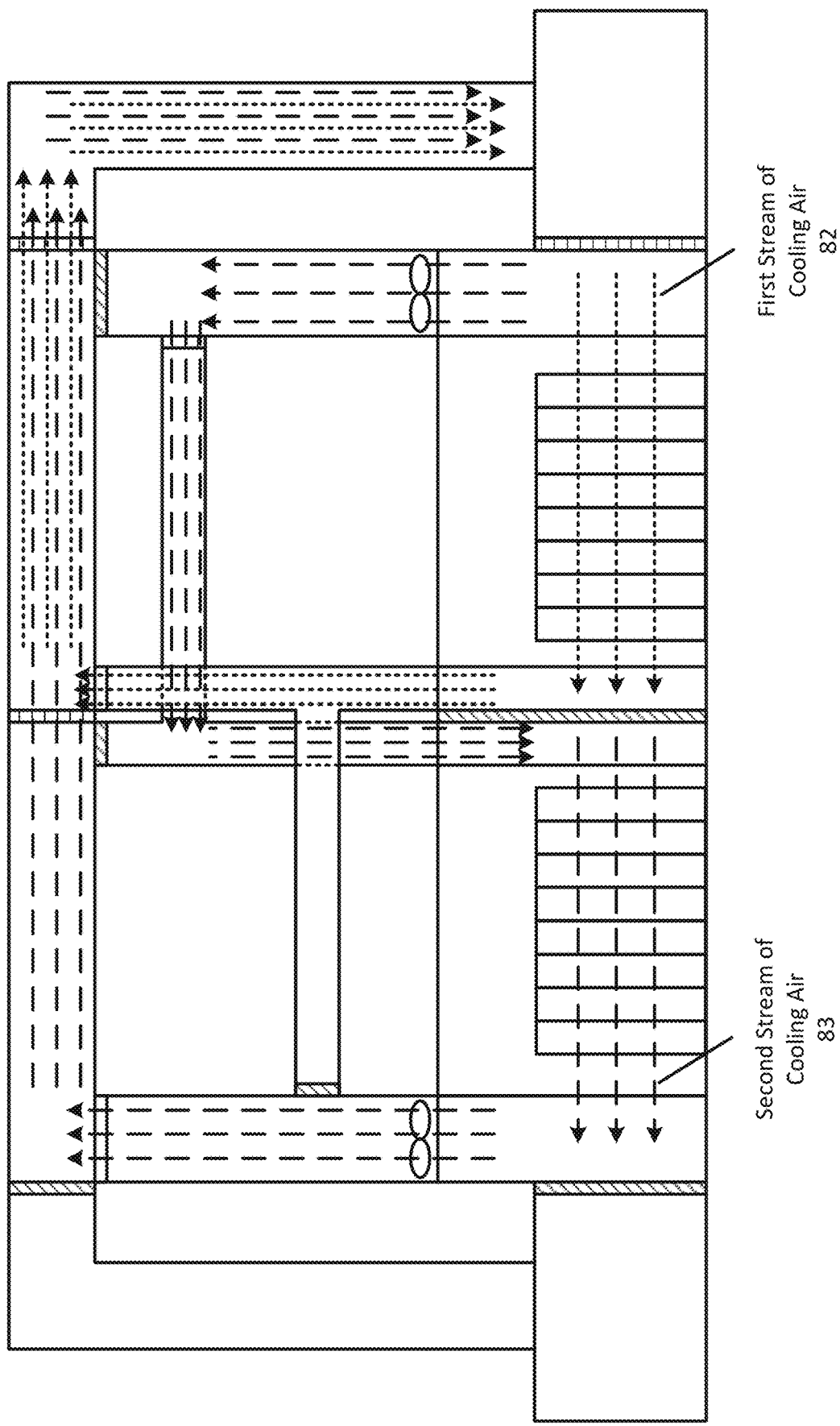

FIGS. 8a and 8b are block diagrams illustrating examples of airflow modes for cooling several IT rooms of a data center in parallel with different air cooling units according to one embodiment. In particular, both figures illustrate parallel airflow modes in which only one of the air cooling units is providing cooling air, while the other is on standby. FIG. 8a shows two streams of cooling air that is being provided by the first air cooling unit 5a and are cooling both IT rooms in parallel. Specifically, there is a first stream of cooling air 82 that is circulating through the first IT room (from the first air chamber) and back to the first air cooling unit via the fourth and first air ducts, and there is a second stream of cooling air 83 that is circulating through the second IT room, which is drawn through the second, seventh, and fifth air ducts from the first air chamber, and back to the first air cooling unit via the third and first air ducts. To create this airflow mode, the second louver 69, the ninth louver 76, the tenth louver 77, the sixth louver 73, and the third louver 70 are open, while the first louver 68, the seventh louver 74, the fourth louver 71, the fifth louver 72, and the eighth louver 75 are closed.

FIG. 8b shows two streams of cooling air that are being provided by the second air cooling unit 5b and are cooling both IT rooms in parallel. In this case, the louvers are configured such that both streams 84 and 85 originate from the second air chamber 8 in a similar fashion to the streams of air of FIG. 8a. Thus, louvers that were configured to be open in FIG. 8a are configured to be closed, and vice a versa in FIG. 8b, except for the tenth louver that remains open and the fifth louver that remains closed.

Figure 9:
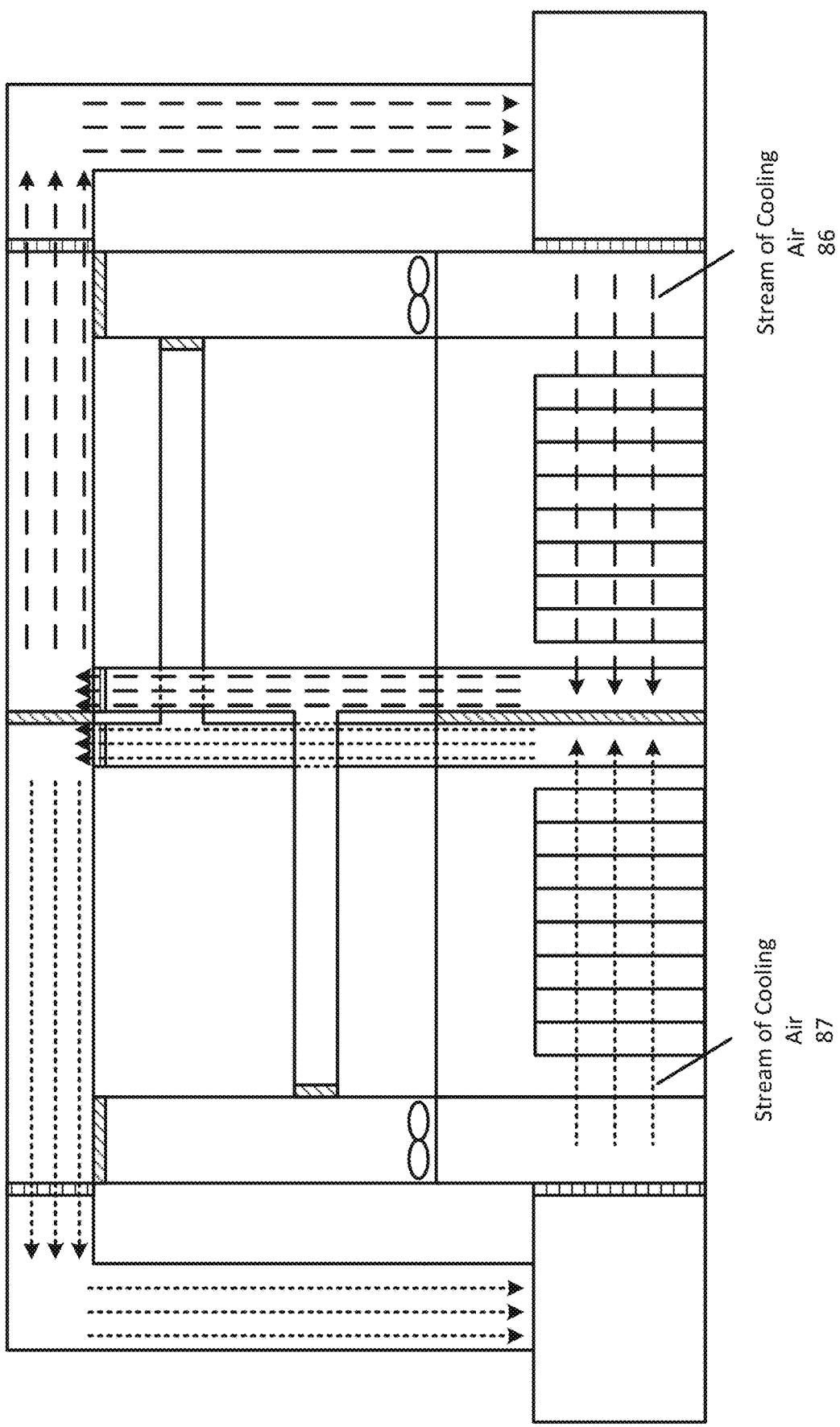
FIG. 9 is a block diagram illustrating an example of an airflow mode for several air cooling units each air cooling a separate IT room according to one embodiment.

FIG. 9 is a block diagram illustrating an example of an airflow mode for several air cooling units each air cooling a separate IT room according to one embodiment. Specifically, this figure shows the first air cooling unit 5a providing a stream of cooling air 86 to cool the pieces of IT equipment in the first IT room 3, while the second air cooling unit 5b is providing another stream of cooling air 87 to cool the pieces of IT equipment in the second IT room 4. Thus, both streams of cooling air circulate through the system and back to their respective air cooling units without coming into contact (or mixing) with one another. To create this airflow mode, the second louver 69, the ninth louver 76, the seventh louver 74, the fourth louver 71 and both louvers 52a and 52b are open, while the first louver 68, the sixth louver 73, the fifth louver 72, the tenth louver 77, the eighth louver 75 and the third louver 70 are closed. In this airflow mode, each air cooling unit may provide cooling air at different temperatures and/or flow rates independently based on the needs of the corresponding IT room.

Figure 10:
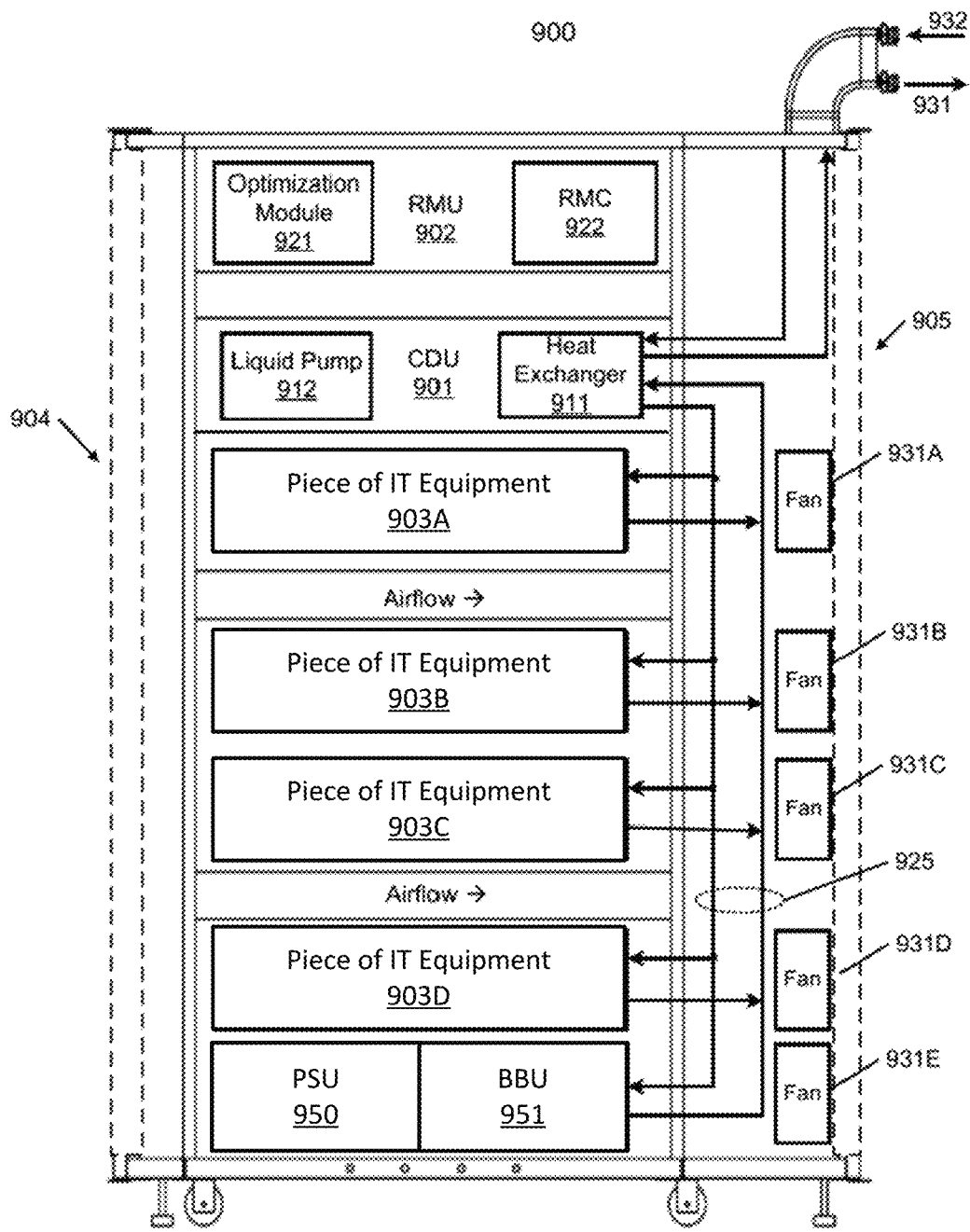
FIG. 10 shows an example of an electronic rack according to one embodiment.

FIG. 10 is a block diagram illustrating an example of an electronic rack according to one embodiment. Electronic rack 900 may include one or more server slots to contain one or more servers respectively. Each server includes one or more information technology (IT) components (e.g., processors, memory, storage devices, network interfaces). According to one embodiment, electronic rack 900 includes, but is not limited to, CDU 901, rack management unit (RMU) 902 (optional), a power supply unit (PSU) 950, the BBU 951 (which may include one or more battery modules), and one or more pieces of IT equipment (or IT equipment) 903A-903D, which may be any type of IT equipment, such as server blades. The IT equipment 903 can be inserted into an array of server slots respectively from frontend 904 or backend 905 of electronic rack 900. The PSU 950 and/or BBU 951 may be inserted into any of server slots 903 within the electronic rack 900. In one embodiment, one or more BBUs may be inserted into any of server slots 903 within the electronic rack 900.

Note that although there are only four pieces of IT equipment 903A-903D shown here, more or fewer pieces of IT equipment may be maintained within electronic rack 900. Also note that the particular positions of CDU 901, RMU 902, PSU 950, BBU 951, and IT equipment 903 are shown for the purpose of illustration only; other arrangements or configurations of CDU 901, RMU 902, BBU 951, and pieces of IT equipment 903 may also be implemented. Note that electronic rack 900 can be either open to the environment or partially contained by a rack container, as long as the cooling fans can generate airflows from the frontend to the backend.

In addition, a fan module can be associated with each of the pieces of IT equipment 903, and the BBU 951. In this embodiment, fan modules 931A-931E, collectively referred to as fan modules 931, and are associated with the pieces of IT equipment 903A-903D, respectively. Each of the fan modules 931 includes one or more cooling fans. Fan modules 931 may be mounted on the backends of IT equipment 903 and/or BBU 951 to generate airflows flowing from frontend 904, traveling through the air space of the IT equipment 903, and existing at backend 905 of electronic rack 900. In one embodiment, each of the fan modules may be mounted on the backends of the pieces of IT equipment 903 and one or more BBU 951. In another embodiment, one or more of the fan modules may be positioned on the frontend 904 of the rack 900. Such frontend fans may be configured to push air into the pieces of IT equipment 903 and/or the BBU 951.

In one embodiment, CDU 901 mainly includes heat exchanger 911, liquid pump 912, and a pump controller (not shown), and some other components such as a liquid reservoir, a power supply, monitoring sensors and so on. Heat exchanger 911 may be a liquid-to-liquid heat exchanger. Heat exchanger 911 includes a first loop with inlet and outlet ports having a first pair of liquid connectors coupled to external liquid supply/return lines 931-932 to form a primary loop. The connectors coupled to the external liquid supply/return lines 931-932 may be disposed or mounted on backend 905 of electronic rack 900. The liquid supply/return lines 931-932 are coupled to a set of room manifolds, which are coupled to an external heat removal system, or external cooling loop. In addition, heat exchanger 911 further includes a second loop with two ports having a second pair of liquid connectors coupled to liquid manifold 925 to form a secondary loop, which may include a supply manifold to supply cooling liquid to the pieces of IT equipment 903 and a return manifold to return warmer liquid back to CDU 901. Note that CDUs 901 can be any kind of CDUs commercially available or customized ones. Thus, the details of CDUs 901 will not be described herein.

Each of the pieces of IT equipment 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. IT equipment 903 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

In one embodiment, the BBU 951 is configured to provide backup power (e.g., drawing battery energy from one or more battery modules contained therein) to the rack (e.g., one or more pieces of IT equipment 903) when the rack is not drawing power from a main power source, such as during a black out.

Electronic rack 900 further includes optional RMU 902 configured to provide and manage power supplied to servers 903, fan modules 931, and CDU 901. Optimization module 921 and RMC 922 can communicate with a controller in some of the applications. RMU 902 may be coupled to PSU 950 to manage the power consumption of the PSU. The PSU 950 may include the necessary circuitry (e.g., an alternating current (AC) to direct current (DC) or DC to DC power converter, backup battery, transformer, or regulator, etc.,) to provide power to the rest of the components of electronic rack 900.

In one embodiment, RMU 902 includes optimization module 921 and rack management controller (RMC) 922. RMC 922 may include a monitor to monitor operating status of various components within electronic rack 900, such as, for example, computing nodes 903, CDU 901, and fan modules 931. Specifically, the monitor receives operating data from various sensors representing the operating environments of electronic rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of CDU 901 to control the speed of liquid pump 912, which in turn controls a liquid flow rate of cooling liquid supplied to the liquid manifold 925 to be distributed to at least some of server blades 903. Therefore, the operating condition and the corresponding cooling device performance are adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT equipment 903 (e.g., 903A, 903B, 903C, and/or 903D) may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. In addition, a switch is not shown here, which can be either air cooled or liquid cooled.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling louvers and/or fans, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A data center air cooling system, comprising:
a first information technology (IT) room of a data center building that has a first set of electronics racks housed therein;
a second IT room of the data center building that has a second set of electronics racks housed therein, each of the first and second sets of electronics racks includes one or more pieces of IT equipment, the second IT room being separate from the first IT room in the data center building;
an air conditioner;
a first air chamber that is between the air conditioner and the first IT room, wherein the air conditioner provides cooling air into the first air chamber that is arranged to supply the cooling air directly into the first IT room;
a second air chamber;

a third air chamber that is between the first IT room and the second IT room, wherein the second air chamber is adjacent to the second IT room and opposite to the third air chamber, wherein the third air chamber comprises a first area adjacent to the first IT room and a second area adjacent to the second IT room;

an air duct system that comprises 1) a first air duct that connects the first air chamber with the second area, 2) a second air duct that connects the second air chamber with the air conditioner, and 3) a third air duct that connects the first area to the second air duct; and a plurality of louvers that are each arranged to open and close independently to create a plurality of airflow modes for cooling the pieces of IT equipment of the first set of electronics racks in the first IT room, the pieces of IT equipment of the second set of electronics racks in the second IT room, or a combination thereof, wherein a first louver of the plurality of louvers is between the first area and the second area.

2. The data center air cooling system of claim 1, wherein the plurality of louvers further comprises 1) a second louver between the first air chamber and the first air duct, 2) a third louver between the first area and the third air duct, and 3) a fourth louver between the second area and the first air duct.

3. The data center air cooling system of claim 2, wherein one of the airflow modes of the plurality of airflow modes comprises an open first louver, a closed second louver, a closed third louver, and a closed fourth louver, which causes cooling air to flow serially through the first IT room, the second IT room, and back to the air conditioner.

4. The data center air cooling system of claim 3 further comprising at least one fan that draws warmed air from the second air chamber that is warmed by pieces of IT equipment of at least one of the first set of electronics racks and the second set of electronics racks and push the warmed air to the air conditioner through the second air duct.

5. The data center air cooling system of claim 2, wherein one of the airflow modes of the plurality of airflow modes comprises a closed first louver, an open second louver, an open third louver, and an open fourth louver, which causes cooling air to flow separately and parallel through the first IT room and the second IT room.

6. The data center air cooling system of claim 5, wherein cooling air flowing through the first IT room flows at a different flow rate than cooling air flowing through the second IT room.

7. The data center air cooling system of claim 5 further comprising at least one fan that draws cooling air from the first air chamber and push the cooling air to the second area of the third air chamber through the first air duct, while the system is in the airflow mode.

8. The data center cooling system of claim 1, wherein each of the first and second set of electronics racks is configured as a pod of electronics racks that is arranged around either a hot aisle or a cold aisle.

9. A data center cooling system, comprising:
a first information technology (IT) room of a data center building that has a first set of electronics racks;
a second IT room of the data center building that has a second set of electronics racks, each of the first and second sets of electronics includes one or more pieces of IT equipment, the second IT room being separate from the first IT room in the data center building;
a first air conditioner that is adjacent to the first IT room and a second air conditioner that is adjacent to the second IT room, wherein at least one of the first and second air conditioners separately provides cooling air into its respectively adjacent IT room;
a first air chamber that is between the first air conditioner and the first IT room;
a second air chamber that is between the second air conditioner and the second IT room;
an air duct system that comprises 1) a first air duct that has a) a first portion that connects to the first air conditioner, b) a second portion that connects to the second air conditioner, and c) a third portion that connects the first portion and the second portion together, 2) a second air duct that connects the first air chamber with the third portion, and 3) a third air duct that connects the second air chamber with the third portion; and
a plurality of louvers that are arranged to open and close independently to create a plurality of airflow modes for cooling pieces of IT equipment in the first IT room, in the second IT room, or a combination thereof.

10. The data center air cooling system of claim 9, wherein the plurality of louvers comprises 1) a first louver between the second air duct and the first air duct, 2) a second louver between the first portion of the first air duct and the third portion of the first air duct, 3) a third louver between the third air duct and the first air duct, and 4) a fourth louver between the second portion of the first air duct and the third portion of the first air duct.

11. The data center air cooling system of claim 10, wherein
a first airflow mode of the plurality of airflow modes comprises a closed first louver, an open second louver, an open third louver, and a closed fourth louver, which causes cooling air provided by the first air conditioner to flow serially through the first IT room, the second IT room, and back to the first air conditioner, and
a second airflow mode of the airflow modes of the plurality of air flow modes comprises an opened first louver, a closed second louver, a closed third louver, and an open fourth louver, which causes cooling air provided by the second air conditioner to flow serially through the second IT room, the first IT room, and then back to the second air conditioner.

12. The data center air cooling system of claim 10 further comprises a third air chamber that is between the first IT room and the second IT room, which has a first area adjacent to the first IT room and a second area adjacent to the second IT room,
wherein a fifth louver of the plurality of louvers is between the first area and the second area,
wherein the air duct system further comprises 1) a fourth air duct that connects the first area of the third air chamber with the first air duct, 2) a fifth air duct that connects the second area of the third air chamber with the first air duct, 3) a sixth air duct that connects the fourth air duct with the third air duct, and 4) a seventh air duct that connects the fifth air duct with the second air duct.

13. The data center air cooling system of claim 12, wherein the plurality of louvers further comprises 1) a sixth louver between the seventh air duct and the second air duct, 2) a seventh louver between the fifth air duct and the first air duct, 3) an eighth louver between the sixth air duct and the third air duct, and 4) a ninth louver between the fourth air duct and the first air duct.

14. The data center air cooling system of claim 13, wherein
a first airflow mode of the plurality of airflow modes comprises a closed first louver, an open second louver, an open third louver, a closed fourth louver, a closed fifth louver, an open sixth louver, a closed seventh louver, a closed eighth louver, and an open ninth louver, which causes cooling air provided by the first air conditioner to flow separately and parallel through the first IT room and the second IT room, a second airflow modes of the plurality of airflow modes comprises an open first louver, a closed second louver, a closed third louver, an open fourth louver, a closed fifth louver, a closed sixth louver, an open seventh louver, an open eighth louver, and a closed ninth louver, which causes cooling air provided by the second air conditioner to flow separately and parallel through the first IT room and the second IT room.

15. The data center air cooling system of claim 13, wherein the third portion of the first air duct comprises a tenth louver, wherein the first louver, the second louver, and the ninth louver connect to the first air duct towards a first side of the tenth louver, while the third louver, the fourth louver, and the seventh louver connect to the first air duct towards a second side of the tenth louver that is opposite to the first side.

16. The data center air cooling system of claim 15, wherein one airflow mode of the plurality of airflow modes comprises a closed first louver, an open second louver, a closed third louver, an open fourth louver, a closed fifth louver, a closed sixth louver, an open seventh louver, a closed eighth louver, an open ninth louver, and a closed tenth louver, which causes cooling air provided by the first air conditioner to flow through the first IT room and back to the first air conditioner and causes cooling air provided by the second air conditioner to flow through the second IT room and back to the second air conditioner.

\* \* \* \* \*